United States Patent
Unno et al.

(10) Patent No.: US 9,548,226 B2
(45) Date of Patent: Jan. 17, 2017

(54) MEMBER FOR SEMICONDUCTOR MANUFACTURING APPARATUS AND METHOD FOR MANUFACTURING THE SAME

(71) Applicant: NGK INSULATORS, LTD., Nagoya (JP)

(72) Inventors: Yutaka Unno, Handa (JP); Tetsuhisa Abe, Tokoname (JP)

(73) Assignee: NGK Insulators, Ltd., Nagoya (JP)

( * ) Notice: Subject to any disclaimer, the term of this patent is extended or adjusted under 35 U.S.C. 154(b) by 144 days.

(21) Appl. No.: 14/058,604

(22) Filed: Oct. 21, 2013

(65) Prior Publication Data

US 2014/0117119 A1   May 1, 2014

Related U.S. Application Data

(60) Provisional application No. 61/718,758, filed on Oct. 26, 2012.

(51) Int. Cl.
| | |
|---|---|
| *H01L 21/67* | (2006.01) |
| *B23K 20/12* | (2006.01) |
| *H01L 21/683* | (2006.01) |
| *H01L 21/687* | (2006.01) |

(52) U.S. Cl.
CPC ..... *H01L 21/67103* (2013.01); *H01L 21/6831* (2013.01); *H01L 21/68792* (2013.01); *B23K 20/12* (2013.01)

(58) Field of Classification Search
None
See application file for complete search history.

(56) References Cited

U.S. PATENT DOCUMENTS

| | | | |
|---|---|---|---|
| 5,721,062 A | 2/1998 | Kobayashi | |
| 6,028,022 A | 2/2000 | Ohashi | |
| 6,251,191 B1 * | 6/2001 | Matsuse | C23C 16/54 118/719 |
| 6,261,708 B1 | 7/2001 | Ohashi et al. | |
| 6,730,175 B2 * | 5/2004 | Yudovsky et al. | 118/728 |
| 6,746,237 B2 * | 6/2004 | Storm | H01L 21/67109 219/490 |
| 6,979,369 B2 * | 12/2005 | Yamaguchi et al. | 118/725 |

(Continued)

FOREIGN PATENT DOCUMENTS

| | | |
|---|---|---|
| JP | 2783980 B2 | 8/1998 |
| JP | 3316167 B2 | 8/2002 |

(Continued)

OTHER PUBLICATIONS

Japanese Office Action (Application No. 2013-215951) dated Jul. 5, 2016 (with English translation).

*Primary Examiner* — Devang R Patel
(74) *Attorney, Agent, or Firm* — Burr & Brown, PLLC

(57) ABSTRACT

A high-frequency power supply includes a shaft bonded to one surface of a plate serving as a gas distributor plate. The plate includes a radio-frequency electrode buried therein. The shaft has a through-hole through which a gas flows. The plate and the shaft are made of a ceramic material. The shaft has a double-tube structure including the inner tube and the outer tube . The interior space of the inner tube forms the through-hole. The plate is hermetically solid-state bonded to the inner tube and the outer tube. The shaft is bonded to the center of the plate.

12 Claims, 7 Drawing Sheets

(56) References Cited

U.S. PATENT DOCUMENTS

| | | | |
|---|---|---|---|
| 7,854,975 B2* | 12/2010 | Fujii | 428/34.4 |
| 8,592,712 B2* | 11/2013 | Fujisato | C23C 14/50 118/723 R |
| 2006/0186109 A1* | 8/2006 | Goto et al. | 219/444.1 |
| 2006/0267494 A1* | 11/2006 | Tomita | H01J 37/32577 313/547 |
| 2007/0221648 A1* | 9/2007 | Unno et al. | 219/385 |
| 2009/0095731 A1 | 4/2009 | Asakura et al. | |
| 2012/0018416 A1* | 1/2012 | Goto | H01L 21/67103 219/481 |
| 2012/0222815 A1 | 9/2012 | Sabri et al. | |
| 2012/0260857 A1* | 10/2012 | Takahashi | H01L 21/67017 118/725 |

FOREIGN PATENT DOCUMENTS

| | | |
|---|---|---|
| JP | 2007-335425 A1 | 12/2007 |
| JP | 4070752 B2 | 4/2008 |
| JP | 4282221 B2 | 6/2009 |

\* cited by examiner

MEMBER FOR SEMICONDUCTOR MANUFACTURING APPARATUS AND METHOD FOR MANUFACTURING THE SAME

The present application claims priority on the basis of the U.S. Provisional Patent Application No. 61/718,758 filed on Oct. 26, 2012, the entire contents of which are incorporated herein by reference.

BACKGROUND OF THE INVENTION

1. Field of the Invention

The present invention relates to a member for a semiconductor manufacturing apparatus and a method for manufacturing the member.

2. Description of the Related Art

A semiconductor manufacturing apparatus includes a component that is installed in a processing chamber for processing wafers and that supplies high-frequency power and a gas (see, for example, Patent Literature 1). Such a component is referred to as a high-frequency power supply. A high-frequency power supply includes a disc-shaped gas distributor plate made of an Al material and an Al tubular shaft for supporting the gas distributor plate. A gas flows through the tubular shaft.

CITATION LIST

Patent Literature

[PTL 1] Japanese Unexamined Patent Application Publication No. 2007-335425 (a showerhead portion 6 in FIG. 1)

SUMMARY OF THE INVENTION

Since known high-frequency power supplies are made of Al, a corrosive process gas corrodes the Al, and the corroded material adheres to wafers. In order to solve this problem, with reference to Japanese Patent No. 4282221, both a gas distributor plate and a tubular shaft were made of a ceramic material. However, the inside of the tubular shaft of the high-frequency power supply, that is, a through-hole through which a gas flows had a problem of arcing. In order to prevent such arcing, the diameter of the through-hole of the tubular shaft was reduced. FIG. 7 illustrates an example of such a structure.

A high-frequency power supply 100 illustrated in FIG. 7 includes a ceramic tubular shaft 104 solid-state bonded to one surface of a ceramic gas distributor plate 102, which includes a radio-frequency electrode buried therein. The ceramic tubular shaft 104 includes a through-hole 106 having a small diameter. The gas distributor plate 102 includes a plurality of holes (not shown) through which a gas from the through-hole 106 is supplied to the other side of the gas distributor plate 102 opposite the side to which the tubular shaft 104 is bonded. Although the high-frequency power supply 100 illustrated in FIG. 7 had no arcing in the through-hole 106, the following problem occurred. With a decrease in the diameter of the through-hole 106 of the tubular shaft 104, the ceramic material forms a greater portion of the cross section of the tubular shaft 104, and the tubular shaft 104 had a crack. Furthermore, this increased heat dissipation from the gas distributor plate 102 via the tubular shaft 104 and thereby decreased the surface temperature of the gas distributor plate 102 in the vicinity of a portion of the gas distributor plate 102 bonded to the tubular shaft 104. Thus, essentially unnecessary deposition occurred at the central portion of the gas distributor plate 102.

Accordingly, in order to solve such problems, it is an object of the present invention to provide a member for a semiconductor manufacturing apparatus that includes a non-corroding gas distributor plate and a non-corroding shaft. The member rarely has cracks or arcing.

A member for a semiconductor manufacturing apparatus of the present invention includes a gas distributor plate including an electrode buried therein; and a shaft bonded to one surface of the gas distributor plate, the shaft having a through-hole through which a gas flows, the gas from the through-hole being discharged from a plurality of holes disposed in the gas distributor plate, wherein the gas distributor plate and the shaft are made of a ceramic material, and the shaft has a double-tube structure including an inner tube and an outer tube, and an interior space of the inner tube forms the through-hole.

Since the member for a semiconductor manufacturing apparatus is made of a ceramic material, even when the gas flowing through the through-hole is a corrosive gas, the gas distributor plate and the shaft are not corroded. Since the shaft has a double structure including the inner tube and the outer tube, and there is a space between the inner tube and the outer tube instead of the ceramic material, the ceramic material forms a reduced portion of the cross section. This reduces the occurrence of cracks in the shaft. Furthermore, the inner diameter of the inner tube can be reduced so that no arcing occurs.

A method for manufacturing such a member for a semiconductor manufacturing apparatus includes placing the inner tube and the outer tube on one surface of the gas distributor plate and solid-state bonding the inner tube and the outer tube to the gas distributor plate by heating the inner tube and the outer tube while each of the inner tube and the outer tube is loaded with a weight.

The electrode buried in the gas distributor plate may be a radio-frequency electrode (RF electrode), a heater electrode, or an electrostatic electrode.

DETAILED DESCRIPTION OF THE INVENTION

[First Embodiment]

Figure 1:
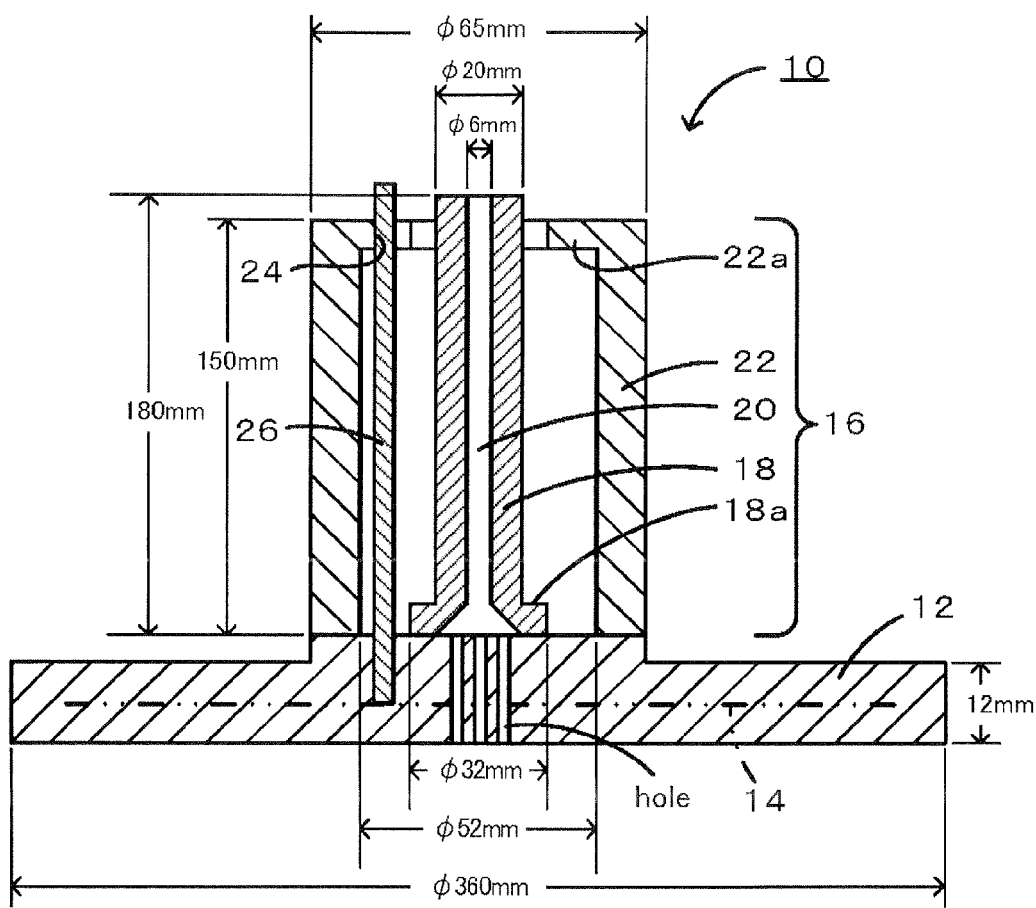
FIG. 1 is a cross-sectional view of a high-frequency power supply 10.

FIG. 1 is a cross-sectional view of a high-frequency power supply 10, which is a member for a semiconductor manufacturing apparatus. The dimensions in the figure are only examples and do not limit the present invention.

The high-frequency power supply 10 includes a shaft 16 bonded to one surface of a plate 12 serving as a gas distributor plate. The plate 12 includes a high-frequency electrode 14 buried therein. The shaft 16 has a through-hole 20 through which a gas flows.

The plate 12 and the shaft 16 are made of a ceramic material.

The shaft 16 has a double-tube structure including the inner tube 18 and the outer tube 22. The interior space of the inner tube 18 forms the through-hole 20.

The plate 12 is hermetically solid-state bonded to the inner tube 18 and the outer tube 22. The shaft 16 is bonded to the center of the plate 12.

The inner tube 18 has an outer flange 18a at an end thereof to which the plate 12 is bonded. The plate 12 has a plurality of through-holes (not shown) corresponding to the inside of the inner tube 18. The inner diameter of the inner tube 18 may be determined in a manner that depends on the pressure of a container (not shown) in the semiconductor manufacturing apparatus or the gas flow rate and is preferably 10 mm or less, more preferably 5 mm or less. A smaller inner diameter is preferred because this results in a lower occurrence of arcing.

The outer tube 22 has no flange at an end thereof to which the plate 12 is bonded and has an inner flange 22a at the other end thereof. The inner diameter of the inner flange 22a is greater than the outer diameter of the inner tube 18. In other words, the inner flange 22a has an opening large enough for the passage of the inner tube 18. The end of the outer tube 22 to which the plate 12 is bonded has substantially the same cross-sectional shape as the cylinder portion (barrel) of the outer tube 22. The cylinder portion of the outer tube 22 preferably has a thickness of 2 mm or more and 7 mm or less, more preferably 3 mm or more and 5 mm or less.

There is a feeding member 26 between the inner tube 18 and the outer tube 22. Electric power is supplied to the high-frequency electrode 14 through the feeding member 26. The feeding member 26 is connected to the high-frequency electrode 14 buried in the plate 12. The inner flange 22a has an opening 24 through which the feeding member 26 passes.

The side surface of the inner tube 18 and the inner flange 22a of the outer tube 22 are hermetically connected to the container (not shown) in the semiconductor manufacturing apparatus (for example, with an O-ring (not shown)). The inner tube 18 is connected to a gas-inlet pipe (not shown). The other end of the inner tube 18 opposite the outer flange 18a preferably protrudes from the level of the outer tube 22. This is because the inner tube 18 can easily be hermetically connected to the gas-inlet pipe. The gas supplied to the through-hole 20 of the inner tube 18 from the gas-inlet pipe is discharged to the outside (in the container) through the holes (not shown) formed in the plate 12. A gas may also be introduced into the through-hole 20 of the inner tube 18 from the outside of the high-frequency power supply 10 through the holes.

Figure 2:
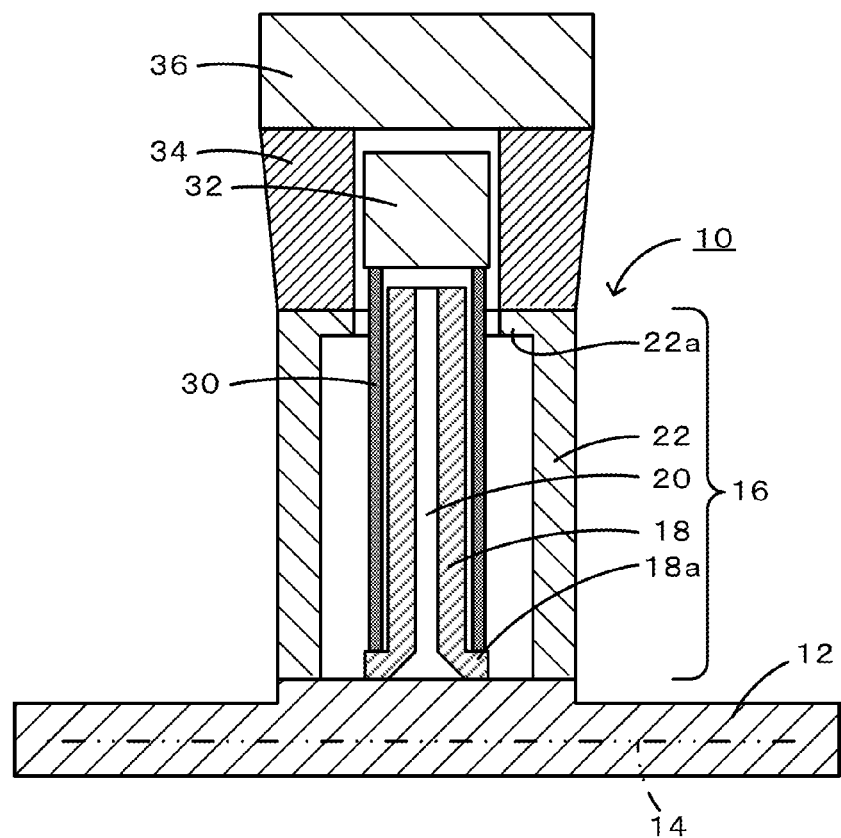
FIG. 2 is a manufacturing process drawing of the high-frequency power supply 10.

The high-frequency power supply 10 is manufactured as described below. FIG. 2 is a manufacturing process drawing of the high-frequency power supply 10. The ceramic material is AlN, for example. A ceramic material other than AlN may also be used.

The inner tube 18 and the outer tube 22 are placed on one surface of the plate 12. The plate 12 is coaxial with the inner tube 18 and the outer tube 22.

The outer flange 18a of the inner tube 18 and the inner flange 22a of the outer tube 22 are then pressed. A jig for pressing the outer flange 18a of the inner tube 18 includes a pressing tube 30 and a weight 32. A jig for pressing the inner flange 22a of the outer tube 22 includes a pressing tube 34 and a weight 36. The pressing tube 34 and the weight 36 surround the pressing tube 30 and the weight 32. Thus, the jigs having high heat capacities are disposed on the shaft 16. This is because this can increase and decrease the temperature of the bonded portion as fast as possible.

The pressing tube 34 is tapered such that the surface of the pressing tube 34 in contact with the inner flange 22a of the outer tube 22 has substantially the same inner diameter and outer diameter as the inner flange 22a. This can close minute gaps in the contact surface and allows the entire pressure to be evenly applied to the inner flange 22a, thereby preventing abnormal deformation of the end of the outer tube 22. Furthermore, pressure can be evenly applied to the bonded portion via the inner flange 22a, thereby allowing uniform bonding due to uniform stress. Furthermore, because of the tapered outer surface of the pressing tube 34 and the same contact surface dimensions of the pressing tube 34 as the inner flange 22a, variations in the shape of the jig during repeated use of the jig can be reduced.

When the ceramic material is AlN, the pressing tubes 30 and 34 are preferably made of BN. This is because BN has a high melting point and does not react with AlN at high temperatures and therefore the pressing tubes 30 and 34 can be easily removed after bonding. The weights 32 and 36 are preferably made of tungsten, which has a high density and a high melting point. This is because tungsten does not react with BN at high temperatures and therefore the weights 32 and 36 can be easily removed after bonding.

It is preferable that the total weight of the pressing tube 34 and the weight 36 is determined in such a way that a pressure in the range of 500 to 700 $g/cm^2$ is applied to the bonding interface. Although hermetic bonding can be achieved at a pressure of 500 $g/cm^2$ or more, a pressure of more than 700 $g/cm^2$ may result in deformation of the outer tube 22 during bonding and undesired dimensional accuracy.

It is preferable that the total weight of the pressing tube 30 and the weight 32 is determined in such a way that a pressure of 500 $g/cm^2$ or more is applied to the bonding interface. Since the pressure is applied only to the outer flange 18a of the inner tube 18, a deformation, if present at all, occurs only in the outer flange 18a. Thus, the pressure is more preferably in the range of 2 to 3 $kg/cm^2$.

The plate 12 and the shaft 16 (the inner tube 18 and the outer tube 22) are bonded together by solid-state bonding. Solid-state bonding is described in detail in Japanese Patent No. 2783980, No. 4070752, and No. 3316167, for example. First, the bonding surface of the shaft 16 and the bonding surface of the plate 12 are flattened to a predetermined roughness. If necessary, an auxiliary agent is applied to the bonding surface(s). The plate 12, the shaft 16, and the bonding jigs (the pressing tubes 30 and 34 and the weights 32 and 36) are assembled as described above. As described in the above-mentioned patents, the assembly is placed in an atmosphere furnace, is heated to a predetermined temperature in an inert gas atmosphere, is kept at a predetermined temperature for a predetermined time, and is cooled. During heating, the weights 32 and 36 apply the pressing force to the bonding interface and cause solid-phase diffusion bonding of the AlN ceramic materials. Use of the weights 32 and 36 as the pressing force allows the use of an atmosphere furnace and obviates the necessity for an apparatus that applies a pressing force from the outside with an oil-hydraulic cylinder. Thus, the bonding process which is highly reproducible and consistent can be provided.

Thus, since the high-frequency power supply 10 described above in detail is entirely made of a ceramic material, even when the gas flowing through the through-hole 20 is a corrosive gas, the plate 12 and the shaft 16 are not corroded. Since the shaft 16 has a double structure including the inner tube 18 and the outer tube 22, and there is a space between the inner tube 18 and the outer tube 22 instead of the ceramic material, the ceramic material forms a reduced portion of the cross section. This reduces the occurrence of cracks in the shaft 16. Furthermore, the inner diameter of the inner tube 18 can be reduced so that no arcing occurs.

Furthermore, a region between the inner tube 18 and the outer tube 22 is isolated from the atmosphere within the container of the semiconductor manufacturing apparatus (the outside atmosphere of the high-frequency power supply 10) and from the atmosphere within the inner tube 18. Thus, the feeding member 26 can be isolated from a corrosive gas introduced into the container. The atmosphere of the region between the inner tube 18 and the outer tube 22 may be air. In the case that the plate 12 is heated to a high temperature, the atmosphere of the region may be an inert gas, such as nitrogen or argon, in order to prevent oxidation of the feeding member 26.

Furthermore, since the inner tube 18 is bonded to the plate 12 via the outer flange 18a, this results in a high bonding strength, increases the proof stress against the bending moment of the inner tube 18, and prevents the inner tube 18 from being disconnected at the bonded portion. The outer flange 18a is an optimum portion for the loading of a weight during bonding.

Furthermore, in the high-frequency power supply 10, while the outer diameter of the portion of the outer tube 22 bonded to the plate 12 is reduced, a region between the outer tube 22 and the inner tube 18 can be sufficiently increased. When the outer diameter of the portion of the outer tube 22 bonded to the plate 12 is small, the heat capacity in the vicinity of the plate can be reduced. This facilitates following of the internal temperature of the container and prevents unnecessary deposition on the plate 12. The inner flange 22a at the end of the outer tube 22 can increase the structural strength of the outer tube 22 and reduce the deformation of the outer tube in bonding.

[Second Embodiment]

Figure 3:
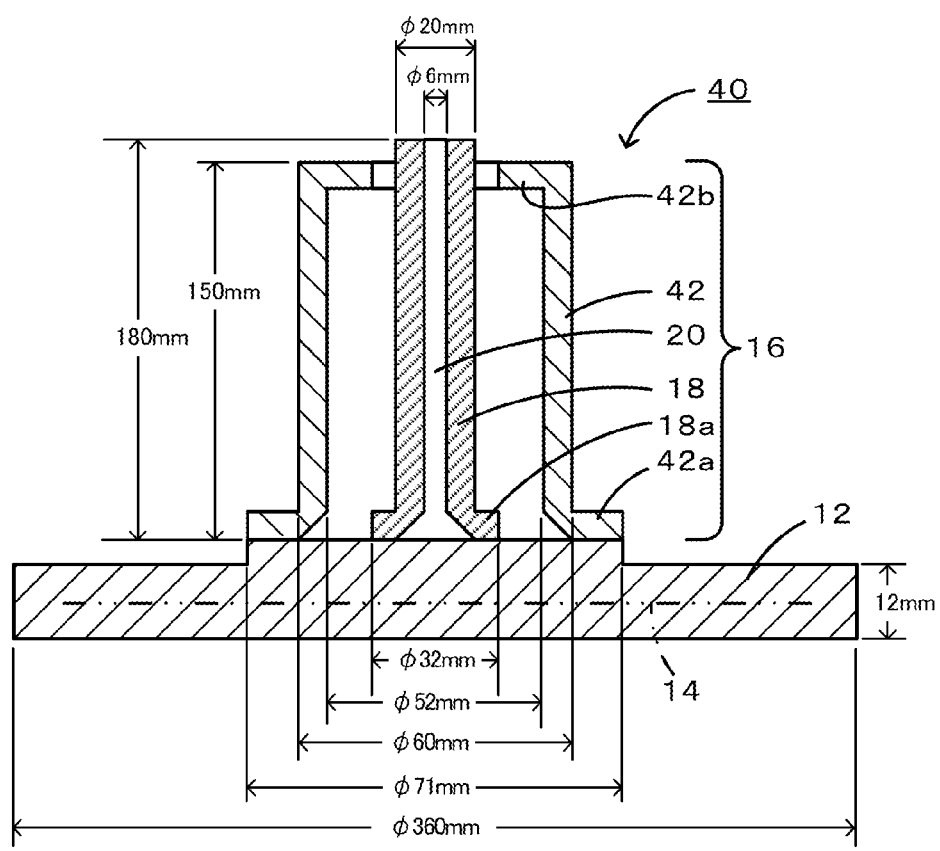
FIG. 3 is a cross-sectional view of a high-frequency power supply 40.

FIG. 3 is a cross-sectional view of a high-frequency power supply 40 according to a second embodiment. The high-frequency power supply 40 is the same as the high-frequency power supply 10 according to the first embodiment except for the shape of an outer tube 42. Thus, the same components are denoted by the same reference numerals and will not be further described.

The outer tube 42 has an outer flange 42a at an end thereof to which the plate 12 is bonded and an inner flange 42b at the other end thereof. The inner diameter of the inner flange 42b is greater than the outer diameter of the inner tube 18. The cylinder portion of the outer tube 42 preferably has a thickness of 2 mm or more and 7 mm or less, more preferably 3 mm or more and 5 mm or less.

Figure 4:
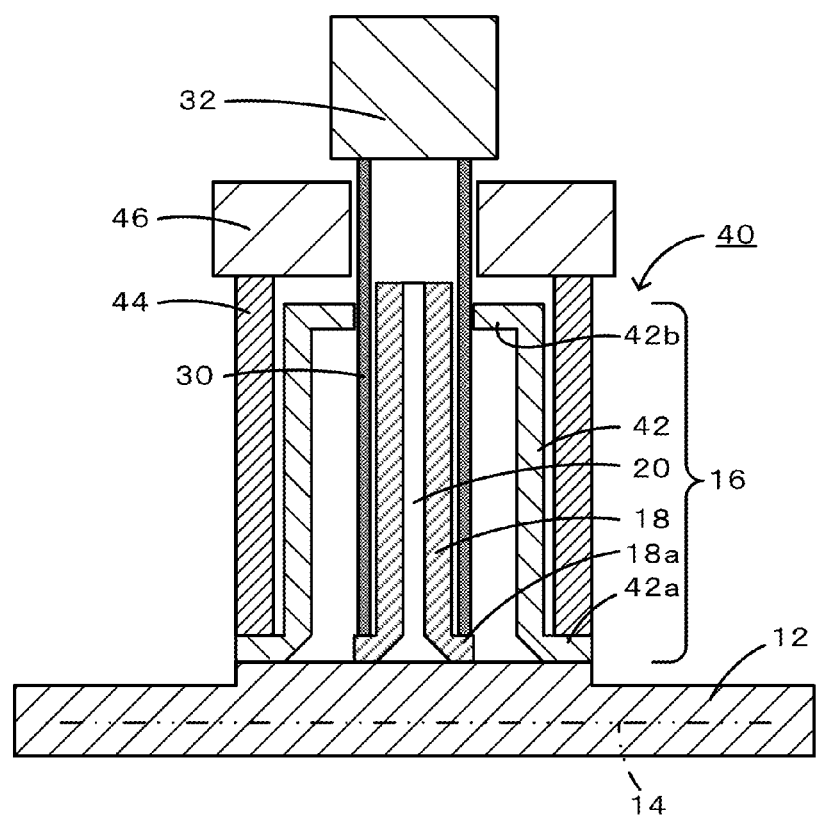
FIG. 4 is a manufacturing process drawing of the high-frequency power supply 40.

The high-frequency power supply 40 is manufactured as described below. FIG. 4 is a manufacturing process drawing of the high-frequency power supply 40. The ceramic material is AlN, for example. A ceramic material other than AlN may also be used.

The inner tube 18 and the outer tube 42 are placed on one surface of the plate 12. The plate 12 is coaxial with the inner tube 18 and the outer tube 42.

The outer flange 18a of the inner tube 18 and the outer flange 42a of the outer tube 42 are then pressed. As in the first embodiment, a jig for pressing the outer flange 18a of the inner tube 18 includes the pressing tube 30 and the weight 32. A jig for pressing the outer flange 42a of the outer tube 42 includes a circular pressing tube 44 and a weight 46. In this case, since no pressing force is applied to the cylinder portion of the outer tube 42 during bonding, the thickness of the outer tube 42 can be reduced as compared with the first embodiment. The outer tube 42 having a small thickness transfers a small amount of heat from the plate 12. This can prevent a poor temperature distribution of the plate 12, particularly when the plate 12 is exposed to high temperatures.

The dimensions of the pressing face of the pressing tube 44 (a portion in contact with the outer flange 42a) are preferably substantially the same as the dimensions of the outer flange 42a. The inner diameter of the pressing tube 44 is preferably slightly greater than the outer diameter of the cylinder portion of the outer tube 42, thereby leaving a clearance therebetween. The pressing tube 44 can evenly apply pressing force to the outer flange 42a. The pressing force is evenly transferred to the bonding interface between the outer flange 42a and the plate 12. Thus, the outer flange 42a and the plate 12 can be evenly bonded together. Since only the outer flange 42a is pressed, and the outer tube 42 is not pressed, the deformation of the outer tube 42 can be completely prevented.

The bonding process is the same as in the first embodiment and will not be described.

Thus, the high-frequency power supply 40 described above in detail has the same advantages as the first embodiment. Furthermore, as described above, the outer tube 42 having a small thickness can prevent a poor temperature distribution of the plate 12.

[Other Embodiments]

The present invention is not limited to the above-described embodiment. It is clear that the present invention can be implemented in a variety of embodiments without departing from the technical scope thereof.

Figure 5:
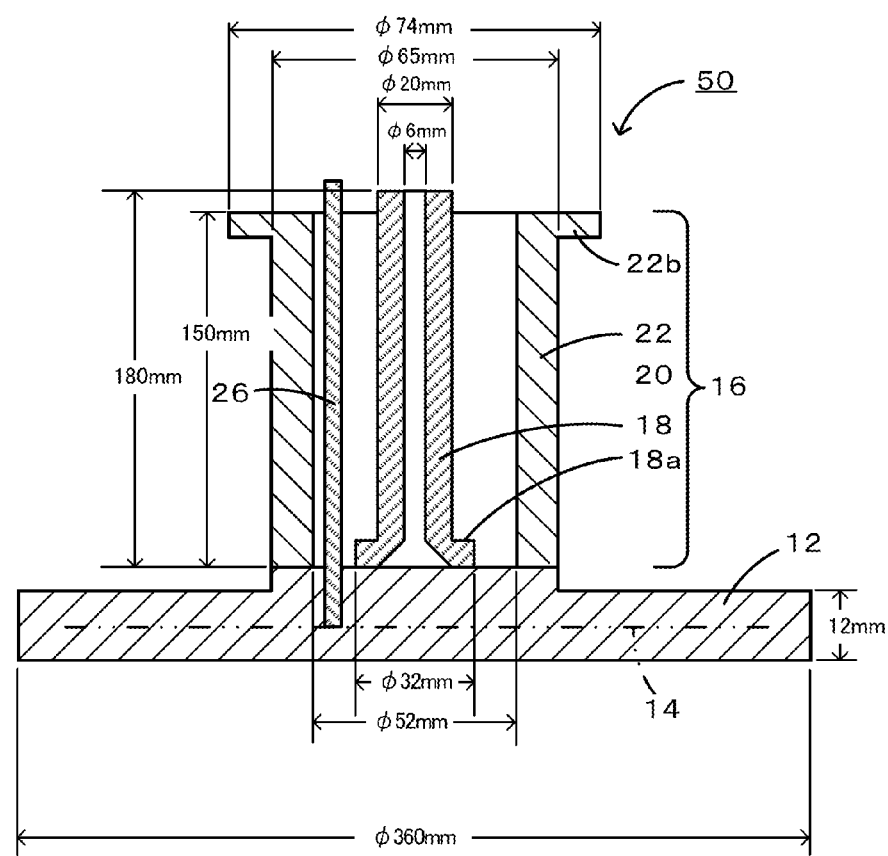
FIG. 5 is a cross-sectional view of a high-frequency power supply 50.

For example, although the inner flange 22a is disposed at the other end of the outer tube 22 to which the plate 12 is bonded in the first embodiment, the inner flange 22a may be replaced by an outer flange 22b as in a high-frequency power supply 50 illustrated in FIG. 5. In this case, the outer flange 22b does not have a hole through which the feeding member 26 passes. Such a structure also has the same advantages as the first embodiment.

Figure 6:
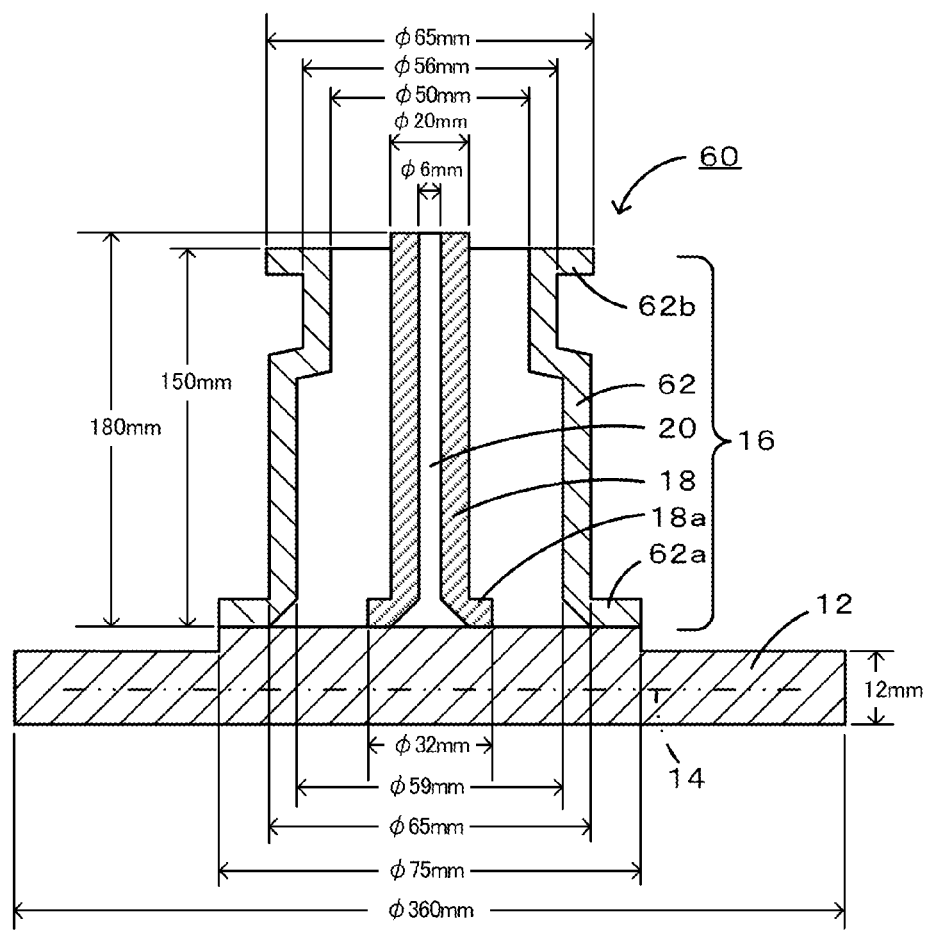
FIG. 6 is a cross-sectional view of a high-frequency power supply 60.

Although the second embodiment includes the outer tube 42 that has the outer flange 42a at an end thereof to which the plate 12 is bonded and the inner flange 42b at the other end thereof, the outer tube 42 may be replaced by an outer tube 62 of a high-frequency power supply 60 illustrated in FIG. 6. The outer tube 62 is a stepped tube that has a large diameter on one side close to the plate 12 and a small diameter on the other side. The outer tube 62 has a first outer flange 62a at an end thereof to which the plate 12 is bonded and a second outer flange 62b at the other end thereof. The inner diameter of the second outer flange 62b (the narrower inner diameter of the stepped tube) is greater than the outer diameter of the inner tube 18. Furthermore, as viewed from the top of the high-frequency power supply 60 (looking down at the high-frequency power supply 60 from above in FIG. 6), the second outer flange 62b does not interfere or overlap with the first outer flange 62a. Thus, the pressing tube 44 and the weight 46 used in the manufacture of the high-frequency power supply 40 can be directly utilized in the manufacture of the high-frequency power supply 60. This is because the second outer flange 62b does not interfere with the pressing tube 44 pressing the first outer flange 62a. As a matter of course, the pressing tube 30 and the weight 32 can also be used to press the outer flange 18a of the inner tube 18.

Although the weight 46 is circular in the second embodiment as illustrated in FIG. 4, the weight 46 may be cylindrical when the pressing tube 30 has a low height as illustrated in FIG. 2 and the top of the pressing tube 44 is higher than the top of the weight 32.

EXAMPLES

Example 1

The high-frequency power supply 10 according to the first embodiment having the dimensions illustrated in FIG. 1 was manufactured. The plate 12 and the shaft 16 (the inner tube 18 and the outer tube 22) were made of AlN.

Example 2

The high-frequency power supply 40 according to the second embodiment having the dimensions illustrated in FIG. 3 was manufactured. The plate 12 and the shaft 16 (the inner tube 18 and the outer tube 42) were made of AlN.

Example 3

The high-frequency power supply 50 having the dimensions illustrated in FIG. 5 was manufactured. The plate 12 and the shaft 16 (the inner tube 18 and the outer tube 22) were made of AlN.

Example 4

The high-frequency power supply 60 having the dimensions illustrated in FIG. 6 was manufactured. The plate 12 and the shaft 16 (the inner tube 18 and the outer tube 62) were made of AlN.

Comparative Example 1

Figure 7:
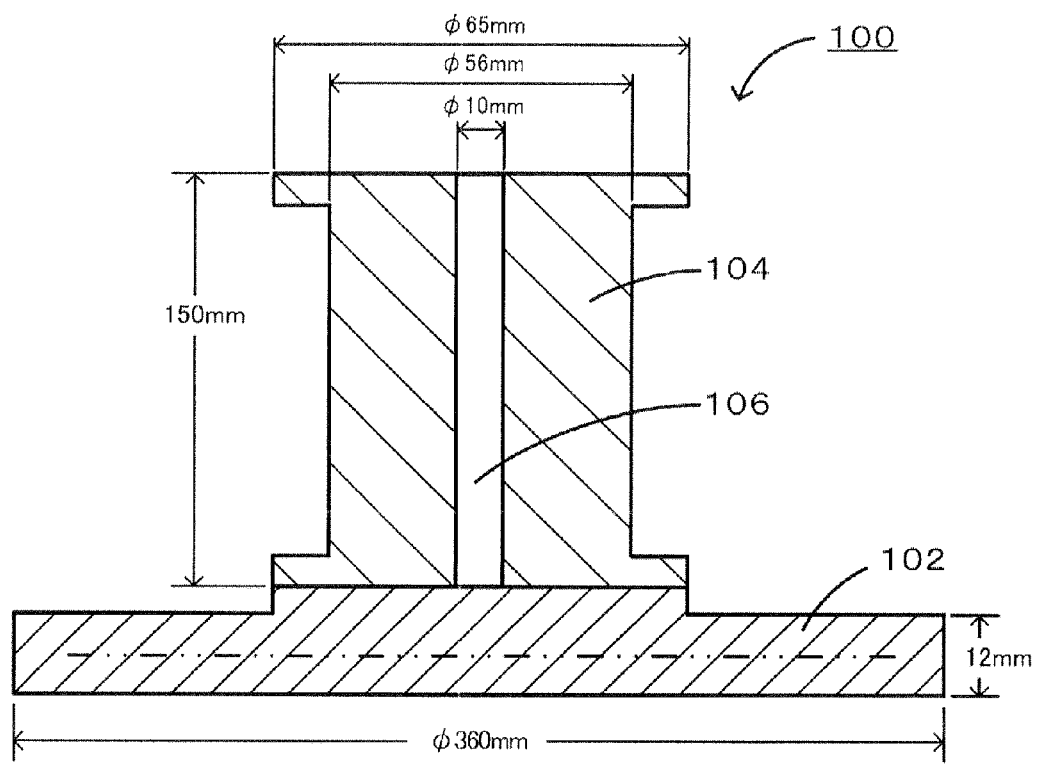
FIG. 7 is a cross-sectional view of a known high-frequency power supply 100.

The high-frequency power supply 100 having the dimensions illustrated in FIG. 7 was manufactured. The gas distributor plate (plate) 102 and the tubular shaft 104 were made of AlN.

[Evaluation]
Presence or Absence of Cracks

After the shaft and the plate were bonded together at 1900° C., the shaft was checked for cracks. No crack was observed in Examples 1 to 4, but cracks were observed in Comparative Example 1 (see Table 1). In Comparative Example 1, the through-hole 106 of the tubular shaft 104 had a small diameter, and the ceramic material formed a large portion of the cross section of the tubular shaft 104. Probably because of this, the tubular shaft 104 had cracks. In contrast, the shaft in Examples 1 to 4 had the double-tube structure including the inner tube and the outer tube, and there was a space between the inner tube and the outer tube instead of the ceramic material. Thus, the ceramic material formed a reduced portion of the cross section. This probably prevented the occurrence of cracks.

Presence or Absence of Deposition (Deposit)

After each high-frequency power supply was used at 200° C., the center of the plate was examined for deposition. No deposition was observed in Examples 1 to 4, but deposition was observed in Comparative Example 1 (see Table 1). The reason for the deposition in Comparative Example 1 is probably that large heat dissipation from the gas distributor plate 102 via the tubular shaft 104 caused a decrease in the surface temperature of the gas distributor plate 102 in the vicinity of the portion bonded to the tubular shaft 104. In contrast, because of smaller heat dissipation from the plate via the shaft (the outer tube and the inner tube) in Examples 1 to 4 than in Comparative Example 1, there was no deposition at the center of the plate in Examples 1 to 4.

TABLE 1

|  | Figures | Shaft structure | Presence or Absence of Cracks | Presence or Absence of Deposition |
|---|---|---|---|---|
| Example 1 | FIG. 1 | Double-tube | Not observed | Not observed |
| Example 2 | FIG. 3 | Double-tube | Not observed | Not observed |
| Example 3 | FIG. 5 | Double-tube | Not observed | Not observed |
| Example 4 | FIG. 6 | Double-tube | Not observed | Not observed |
| Comparative Example 1 | FIG. 7 | Single-tube | Observed | Observed |

What is claimed is:

1. A high-frequency power supply for a semiconductor manufacturing apparatus, comprising: a gas distributor plate including an RF electrode buried therein; and a shaft bonded to one surface of the gas distributor plate, the shaft having a through-hole through which a gas flows, the gas from the through-hole being discharged from a plurality of holes disposed in the gas distributor plate, wherein
   the gas distributor plate and the shaft are made of a ceramic material,
   the shaft has a double-tube structure including an inner tube and an outer tube, a first interior space within the inner tube to form the through-hole through which the gas flows, and a second interior space between a radially outer surface of the inner tube and a radially inner surface of the outer tube, and
   the plurality of holes extend from the one surface of the gas distributor plate to a second surface of the gas distributor plate that is opposite to the one surface of the gas distributor plate.

2. The high-frequency power supply for a semiconductor manufacturing apparatus according to claim 1, wherein
   the inner tube has an outer flange at an end thereof to which the gas distributor plate is bonded, and
   the outer tube has no flange at an end thereof to which the gas distributor plate is bonded and has an inner flange at the other end thereof, the inner diameter of the inner flange being greater than the outer diameter of the inner tube.

3. The high-frequency power supply for a semiconductor manufacturing apparatus according to claim 1, wherein
   the inner tube has an outer flange at an end thereof to which the gas distributor plate is bonded, and
   the outer tube has an outer flange at an end thereof to which the gas distributor plate is bonded and an inner flange at the other end thereof, the inner diameter of the inner flange being greater than the outer diameter of the inner tube.

4. The high-frequency power supply for a semiconductor manufacturing apparatus according to claim 1, wherein
   the inner tube has an outer flange at an end thereof to which the gas distributor plate is bonded, and
   the outer tube has no flange at an end thereof to which the gas distributor plate is bonded and has an outer flange at the other end thereof, the inner diameter of the outer flange being greater than the outer diameter of the inner tube.

5. The high-frequency power supply for a semiconductor manufacturing apparatus according to claim 1, wherein
the inner tube has an outer flange at an end thereof to which the gas distributor plate is bonded, and
the outer tube is a stepped tube having a larger diameter on the side thereof to be bonded to the gas distributor plate and has a first outer flange at an end thereof to which the gas distributor plate is bonded and a second outer flange at the other end thereof, the inner diameter of the second outer flange being greater than the outer diameter of the inner tube, the second outer flange not interfering with the first outer flange as viewed from the top of the member for a semiconductor manufacturing apparatus.

6. A method for manufacturing the high-frequency power supply for a semiconductor manufacturing apparatus according to claim 1, comprising:
placing the inner tube and the outer tube on one surface of the gas distributor plate; and solid-state bonding the inner tube and the outer tube to the gas distributor plate by heating the inner tube and the outer tube while each of the inner tube and the outer tube is loaded with a weight.

7. A method for manufacturing the high-frequency power supply for a semiconductor manufacturing apparatus according to claim 2, comprising:
placing the inner tube and the outer tube on one surface of the gas distributor plate; and solid-state bonding the inner tube and the outer tube to the gas distributor plate by heating the inner tube and the outer tube while each of the outer flange of the inner tube and the inner flange of the outer tube is loaded with a weight.

8. A method for manufacturing the high-frequency power supply for a semiconductor manufacturing apparatus according to claim 3, comprising:
placing the inner tube and the outer tube on one surface of the gas distributor plate; and solid-state bonding the inner tube and the outer tube to the gas distributor plate by heating the inner tube and the outer tube while each of the outer flange of the inner tube and the outer flange of the outer tube is loaded with a weight.

9. A method for manufacturing the high-frequency power supply for a semiconductor manufacturing apparatus according to claim 4, comprising:
placing the inner tube and the outer tube on one surface of the gas distributor plate; and solid-state bonding the inner tube and the outer tube to the gas distributor plate by heating the inner tube and the outer tube while each of the outer flange of the inner tube and the outer flange of the outer tube is loaded with a weight.

10. A method for manufacturing the high-frequency power supply for a semiconductor manufacturing apparatus according to claim 5, comprising:
placing the inner tube and the outer tube on one surface of the gas distributor plate; and solid-state bonding the inner tube and the outer tube to the gas distributor plate by heating the inner tube and the outer tube while each of the outer flange of the inner tube and the first outer flange of the outer tube is loaded with a weight.

11. The high-frequency power supply for a semiconductor manufacturing apparatus according to claim 1, wherein the gas distributor plate, the inner tube and the outer tube are made of the same ceramic material.

12. The high-frequency power supply for a semiconductor manufacturing apparatus according to claim 1, wherein the inner tube and the outer tube are coaxial.

* * * * *